US012593672B2

(12) United States Patent
Hu et al.

(10) Patent No.: US 12,593,672 B2
(45) Date of Patent: Mar. 31, 2026

(54) INTEGRATED CIRCUIT PACKAGE AND METHOD

(71) Applicant: Taiwan Semiconductor Manufacturing Co., Ltd., Hsinchu (TW)

(72) Inventors: Hsien-Pin Hu, Zhubei (TW); Shang-Yun Hou, Jubei (TW); Shih-Wen Huang, Shuishang Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 638 days.

(21) Appl. No.: 17/837,686

(22) Filed: Jun. 10, 2022

(65) Prior Publication Data

US 2023/0260896 A1     Aug. 17, 2023

Related U.S. Application Data

(60) Provisional application No. 63/268,175, filed on Feb. 17, 2022.

(51) Int. Cl.
*H01L 23/00* (2006.01)
*H01L 21/48* (2006.01)
(Continued)

(52) U.S. Cl.
CPC .......... *H01L 23/5226* (2013.01); *H01L 21/56* (2013.01); *H01L 21/76898* (2013.01); *H01L 23/3114* (2013.01); *H01L 23/5283* (2013.01)

(58) Field of Classification Search
CPC ............. H01L 23/3135; H01L 23/3677; H01L 23/3738; H01L 24/08; H01L 24/09; H01L 25/0657; H01L 24/80; H01L 25/0652; H01L 25/105; H01L 2224/08145; H01L 2924/37001; H01L 2224/08146;
(Continued)

(56) References Cited

U.S. PATENT DOCUMENTS

| | | |
|---|---|---|
| 8,373,069 B2 | 2/2013 | Kariya et al. |
| 9,000,584 B2 | 4/2015 | Lin et al. |

(Continued)

FOREIGN PATENT DOCUMENTS

| | | |
|---|---|---|
| CN | 113808961 A | 12/2021 |
| JP | 2010157690 A | 7/2010 |

(Continued)

*Primary Examiner* — Ajay Ojha
*Assistant Examiner* — Tsz K Chiu
(74) *Attorney, Agent, or Firm* — Slater Matsil, LLP

(57) ABSTRACT

A device package including an interposer. The interposer comprising: a semiconductor substrate; first through vias extending through the semiconductor substrate; an interconnect structure comprising: a first metallization pattern in an inorganic insulating material; and a passivation film over the first metallization pattern; and a first redistribution structure over the passivation film. The first redistribution structure comprising a second metallization pattern in an organic insulating material. The device package further including an integrated circuit die over and attached to the interposer; and a first encapsulant around the integrated circuit die.

20 Claims, 18 Drawing Sheets

(51) Int. Cl.

| | |
|---|---|
| *H01L 21/56* | (2006.01) |
| *H01L 21/768* | (2006.01) |
| *H01L 23/31* | (2006.01) |
| *H01L 23/522* | (2006.01) |
| *H01L 23/528* | (2006.01) |

(58) Field of Classification Search

CPC ..... H01L 23/3128; H01L 23/36; H01L 25/18; H01L 25/50; H01L 2224/08221; H01L 2224/09519; H01L 2224/80895; H01L 2224/80896; H01L 2225/06524; H01L 2225/06541; H01L 2225/06589; H01L 2225/1023; H01L 2225/1058; H01L 2225/1094; H01L 2924/1431; H01L 2924/1434; H01L 24/04; H01L 24/07; H01L 24/97; H01L 25/0655; H01L 23/5226; H01L 23/3114; H01L 23/5283; H01L 23/481; H01L 23/3107; H01L 23/3157; H01L 23/5384; H01L 23/5386

See application file for complete search history.

(56) References Cited

U.S. PATENT DOCUMENTS

| | | | | |
|---|---|---|---|---|
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,368,479 | B2 * | 6/2016 | Katkar | H01L 23/5386 |
| 9,372,206 | B2 | 6/2016 | Wu et al. | |
| 9,496,189 | B2 | 11/2016 | Yu et al. | |
| 9,583,415 | B2 * | 2/2017 | Yu | H01L 23/36 |
| 9,735,131 | B2 * | 8/2017 | Su | H01L 25/50 |
| 9,780,079 | B2 * | 10/2017 | Li | H01L 25/50 |
| 9,799,619 | B2 | 10/2017 | Jin et al. | |
| 10,026,704 | B2 * | 7/2018 | Wu | H01L 23/481 |
| 10,062,678 | B2 * | 8/2018 | Fogal | H01L 21/54 |
| 10,141,259 | B1 * | 11/2018 | Nakano | H01L 25/065 |
| 10,153,178 | B2 * | 12/2018 | Zhou | H01L 23/3121 |
| 10,153,222 | B2 * | 12/2018 | Yu | H01L 25/0657 |
| 10,192,816 | B2 * | 1/2019 | Kelly | H01L 23/49811 |
| 10,192,852 | B2 * | 1/2019 | Chandolu | H01L 25/0657 |
| 10,217,702 | B2 * | 2/2019 | Lin | H01L 24/19 |
| 10,297,519 | B2 * | 5/2019 | Lin | H01L 24/97 |
| 10,497,668 | B2 * | 12/2019 | Yu | H01L 23/3675 |
| 10,504,824 | B1 * | 12/2019 | Pan | H01L 21/304 |
| 10,510,561 | B2 * | 12/2019 | Tsai | H01L 23/5385 |
| 10,510,629 | B2 * | 12/2019 | Chen | H01L 23/367 |
| 10,510,684 | B2 * | 12/2019 | Wu | H01L 23/147 |
| 10,535,632 | B2 * | 1/2020 | Jeng | H01L 24/20 |
| 10,720,401 | B2 * | 7/2020 | Ting | H01L 25/50 |
| 10,748,870 | B2 * | 8/2020 | Yu | G05F 3/02 |
| 10,770,430 | B1 * | 9/2020 | Kim | H01L 25/50 |
| 10,784,247 | B2 * | 9/2020 | Chen | H01L 25/105 |
| 10,790,162 | B2 * | 9/2020 | Tsai | H01L 23/5389 |
| 10,818,651 | B2 * | 10/2020 | Hsu | H01L 24/49 |
| 10,833,052 | B2 * | 11/2020 | Shih | H01L 23/5383 |
| 10,991,640 | B2 * | 4/2021 | Kim | H01L 23/5385 |
| 11,062,971 | B2 * | 7/2021 | Hung | H01L 21/4882 |
| 11,133,258 | B2 | 9/2021 | Yu et al. | |
| 11,183,399 | B2 * | 11/2021 | Wei | H01L 24/81 |
| 11,195,816 | B2 * | 12/2021 | Yu | H01L 24/20 |
| 12,074,140 | B2 * | 8/2024 | Yu | H01L 23/3135 |
| 2007/0023889 | A1 * | 2/2007 | Salmon | G02B 6/43 |
| | | | | 257/E23.072 |
| 2011/0001148 | A1 * | 1/2011 | Sun | H10H 20/856 |
| | | | | 257/E33.059 |
| 2011/0186990 | A1 * | 8/2011 | Mawatari | H01L 23/481 |
| | | | | 257/737 |
| 2011/0215457 | A1 * | 9/2011 | Park | H01L 25/50 |
| | | | | 257/E23.101 |
| 2012/0025388 | A1 * | 2/2012 | Law | H01L 25/0657 |
| | | | | 257/773 |
| 2013/0119528 | A1 * | 5/2013 | Groothuis | H01L 23/3675 |
| | | | | 257/777 |
| 2013/0277821 | A1 * | 10/2013 | Lundberg | H01L 23/3677 |
| | | | | 257/713 |
| 2014/0084444 | A1 * | 3/2014 | Lin | H01L 25/0657 |
| | | | | 438/122 |
| 2015/0035134 | A1 * | 2/2015 | Hung | H01L 24/92 |
| | | | | 257/712 |
| 2015/0155011 | A1 * | 6/2015 | Schenck | G11C 5/063 |
| | | | | 365/51 |
| 2015/0155218 | A1 * | 6/2015 | Hung | H01L 23/49827 |
| | | | | 257/713 |
| 2015/0170991 | A1 * | 6/2015 | Li | H01L 23/4334 |
| | | | | 438/109 |
| 2015/0348956 | A1 * | 12/2015 | Groothuis | H01L 23/3677 |
| | | | | 438/107 |
| 2016/0013115 | A1 * | 1/2016 | Vadhavkar | H01L 23/3675 |
| | | | | 257/713 |
| 2016/0013173 | A1 * | 1/2016 | Vadhavkar | H01L 23/3675 |
| | | | | 438/109 |
| 2016/0049349 | A1 * | 2/2016 | Lane | H01L 23/3677 |
| | | | | 257/777 |
| 2016/0093598 | A1 * | 3/2016 | Jo | H01L 23/36 |
| | | | | 257/713 |
| 2016/0322340 | A1 * | 11/2016 | Li | H01L 25/0657 |
| 2017/0140947 | A1 * | 5/2017 | Tsai | H01L 21/561 |
| 2017/0229439 | A1 * | 8/2017 | Vadhavkar | H01L 24/13 |
| 2018/0108592 | A1 * | 4/2018 | Hembree | H01L 23/367 |
| 2019/0006549 | A1 * | 1/2019 | Yim | H01L 25/167 |
| 2019/0088620 | A1 * | 3/2019 | Lin | H01L 21/568 |
| 2019/0123019 | A1 * | 4/2019 | Yu | H10B 63/84 |
| 2019/0164860 | A1 * | 5/2019 | Lin | H01L 23/481 |
| 2019/0237430 | A1 | 8/2019 | England | |
| 2020/0176384 | A1 * | 6/2020 | Wu | H01L 25/0655 |
| 2020/0185330 | A1 * | 6/2020 | Yu | H01L 24/24 |
| 2020/0381397 | A1 * | 12/2020 | Yu | H01L 24/08 |
| 2021/0028145 | A1 * | 1/2021 | Yu | H01L 23/367 |
| 2021/0193637 | A1 | 6/2021 | Jeng et al. | |
| 2021/0202354 | A1 * | 7/2021 | Chuang | H01L 21/4875 |
| 2021/0225790 | A1 * | 7/2021 | Chen | H01L 24/19 |
| 2021/0375768 | A1 | 12/2021 | Tsou et al. | |
| 2022/0045016 | A1 | 2/2022 | Jeng et al. | |
| 2023/0223360 | A1 | 7/2023 | Jeng et al. | |

FOREIGN PATENT DOCUMENTS

| | | | |
|---|---|---|---|
| JP | 2019080037 | A | 5/2019 |
| KR | 20170022761 | A | 3/2017 |
| KR | 20210010806 | A | 1/2021 |
| TW | 202207371 | A | 2/2022 |

* cited by examiner

200

216
212
210
206B
204
202

214

214

206A

206

201
203

200

236
232
228
224
220
216
212
210
206B
204
202

234
218
230
226
222
214
206A
214
201
203

240
206

200

242
236
232
228
224
220
216
212
210
206B
204
202

234
230
226
222
218
214
206A
214

201
203

240
206

200″

242
236
234
232
230
228
226
224
222
220
218
216
202
201
203
240

INTEGRATED CIRCUIT PACKAGE AND METHOD

PRIORITY

This application claims the benefit of U.S. Provisional Application No. 63/268,175, filed on Feb. 17, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
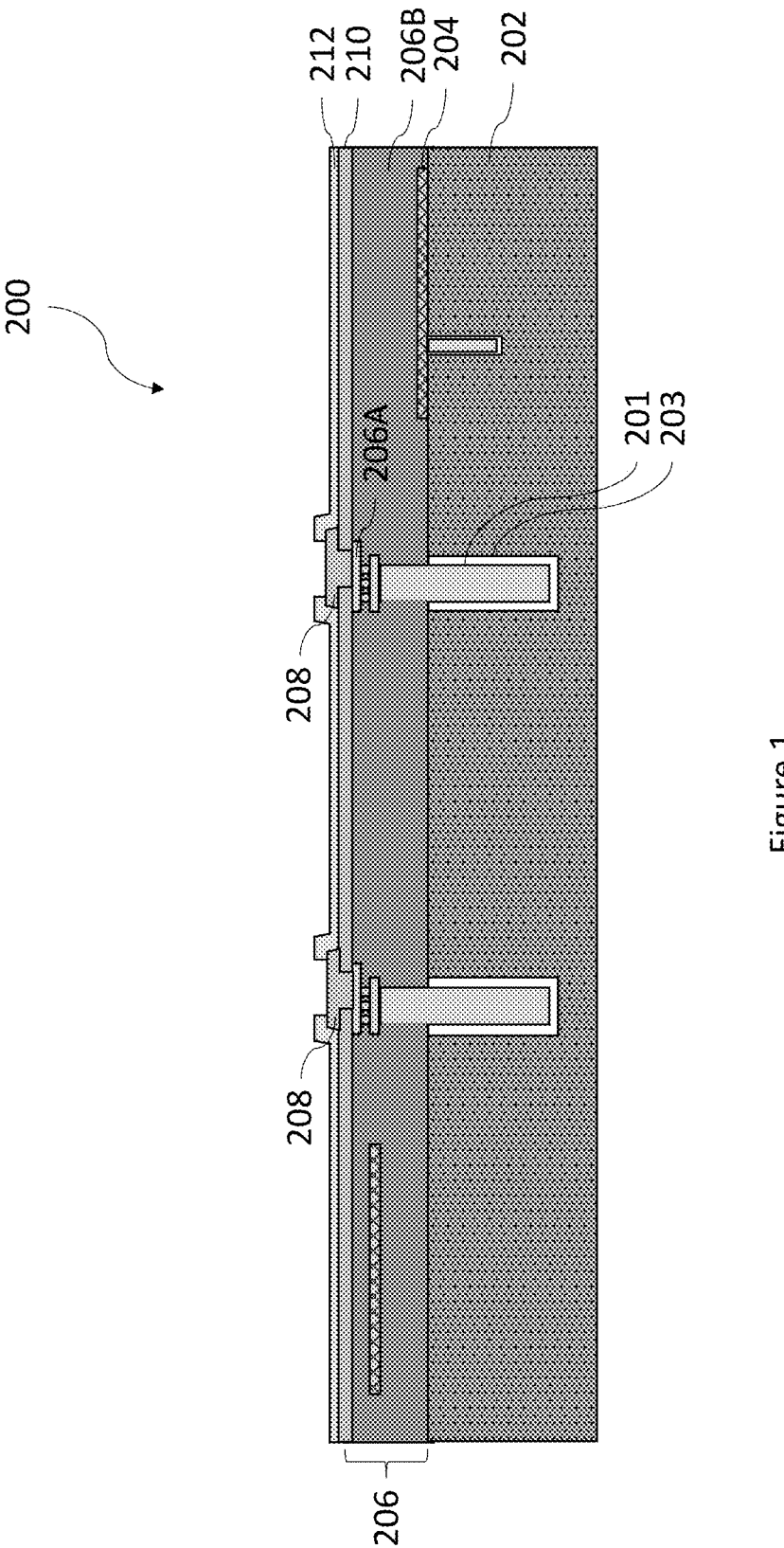
FIGS. 1 through 6 illustrate cross-sectional views of manufacturing an interposer according to some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, semiconductor devices may be bonded together to provide Chip-on-Wafer-on-Substrate (CoWoS™) package having multiple dies bonded to an interposer. The interposer may include metallization layers that are plated in patterned photoresist masks, which are subsequently replaced with organic insulating layers. Optionally, the interposer may further include additional metallization layers formed in inorganic insulating materials through damascene processes. The inclusion of metallization layers in organic insulating layers allows of improved signal integrity and/or power integrity at high, operating frequencies (e.g., greater than 20 GHz). Further, embodiments including metallization layers formed in both organic and inorganic insulating materials may provide improved flexibility in terms of processing and packaging design. Although embodiments herein are described in a particular context, namely a CoWoS packaging scheme, embodiments may also be allowed to other packaging schemes.

FIGS. 1 through 6 are cross-sectional views of intermediate steps of a process for forming an interposer 200 (see FIG. 6) in accordance with some embodiments. The interposer may include metallization patterns in organic insulating layers, providing improved signal integrity/power integrity at high operating frequencies.

Referring to FIG. 1, an interposer 200 is illustrated at an intermediate stage of processing. The interposer 200 may be formed as part of a larger wafer. The interposer 200 may be processed according to applicable manufacturing processes to form integrated circuits in the interposer 200. For example, the interposer 200 may include a semiconductor substrate 202, such as silicon, doped or undoped, or an active layer of a semiconductor-on-insulator (SOI) substrate. The semiconductor substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multilayered or gradient substrates, may also be used.

Active and/or passive devices, such as transistors, diodes, capacitors, resistors, inductors, etc., may be formed in and/or on the semiconductor substrate 202. For example, the interposer 200 may include an integrated deep trench capacitor (iCAP) 204A, which includes portions disposed on a top surface of the semiconductor substrate 202 as well as portions extending into the semiconductor substrate 202. Other types of capacitors, such as deep trench capacitors (DTC) or the like are also possible. In some embodiments, the interposer 200 is free of any active devices, and only passive devices are formed in and/or on the semiconductor substrate 202. In other embodiments, the interposer 200 may be free of both active and passive devices.

The devices may be interconnected by an interconnect structure 206 comprising, for example, metallization patterns 206A in one or more dielectric layers 206B (also referred to as insulating material layers 206B) on the semiconductor substrate 202. The dielectric layers 206B may be formed of inorganic materials that are deposited by CVD processes and patterned using damascene processes (e.g., single damascene processes, dual damascene processes, or the like). As an example of a damascene process, a dielectric layer 206B may be deposited, and openings may be patterned in the dielectric layer 206B (e.g., with photolithography and/or etching). Subsequently, the openings in the dielectric layer 206B may be filled with a conductive material, and excess conductive material may be removed through a planarization process (e.g., a chemical mechanical polish (CMP) or the like) to form a metallization pattern 206A. The interconnect structures 206 electrically connect the devices on the substrate 202 to form one or more integrated circuits. In some embodiments, additional passive devices 204B (e.g., capacitors, resistors, inductors, etc.) may be formed in the interconnect structure 206. For example, the interconnect structure 206 may include a metal-insulator-metal (MIM) capacitor, or the like. Although FIG. 1 illustrates the interconnect structure 206 as having two layers of metallization patterns 206A, embodiments contemplate the interconnect structure 206 having any number of metallization patterns layer, such as from one layer to five layers of metallization patterns 206A.

The interposer 200 further includes through vias 201, which may be electrically connected to the metallization patterns 206A in the interconnect structure 206. The through vias 201 may comprise a conductive material (e.g., copper, or the like) and may extend from a metallization pattern 206A into the substrate 202. One or more insulating barrier layers 203 may be formed around at least portions of the through vias 201 in the substrates 202. The insulating barrier layers 203 may comprise, for example, silicon oxide, silicon nitride, silicon oxynitride, or the like, and may be used to physically and electrically isolate the through vias 201 from each other and the substrate 202. In subsequent processing steps, the substrate 202 may be thinned to expose the through vias 201 (see FIG. 15). After thinning, the through vias 201 provide electrical connection from a back side of the substrate 202 to a front side of the substrate 202. In various embodiments, the backside of the substrate 202 may refer to a side of the substrate 202 opposite to the devices and the interconnect structure 206 while the front side of the substrate 202 may refer to a side of the substrate 202 on which the devices and the interconnect structure 206 are disposed.

In an embodiment, the interposer 200 further comprises contact pads 208, which allow connections to be made to the interconnect structure 206 and the devices on the substrate 202. The contact pads 208 may comprise copper, aluminum (e.g., 28K aluminum), or another conductive material. The contact pads 208 are electrically connected to the metallization patterns 206A of the interconnect structure 206. One or more passivation films may be disposed on the interconnect structure 206, and the contact pads 208. For example, the interconnect structure 206 may include passivation films 210 and 212. The passivation films 210 and 212 may each comprise an inorganic material, such as silicon oxide, silicon oxynitride, silicon nitride, or the like. In some embodiments, the materials of the passivation films 210 and 212 may be the same or different from each other. Further, the materials of the passivation films 210 and 212 may be the same or different from the materials of the dielectric layers 206B. In some embodiments, the contact pads 208 extend over and cover edges of the passivation film 210, and the passivation film 212 extends over and covers edges of the contact pads 208.

The interposer 200 may be formed as part of a larger wafer (e.g., connected to other interposer 200). In some embodiments, the interposer 200 may be singulated from each other after packaging. For example, the interposer 200 may packaged while still connected as part of a wafer. In some embodiments, a chip probe (CP) test may be applied to each of the interposer 200 (e.g., through the contact pads 208). The CP test checks electrical functionality of the interposer 200, and dies that pass the CP tests are referred to as known good dies (KGDs). Interposers 200 that do not pass the CP tests are discarded or repaired. In this manner. KGDs are provided for packaging, which reduces waste and expense of packaging a faulty die.

Figure 2:
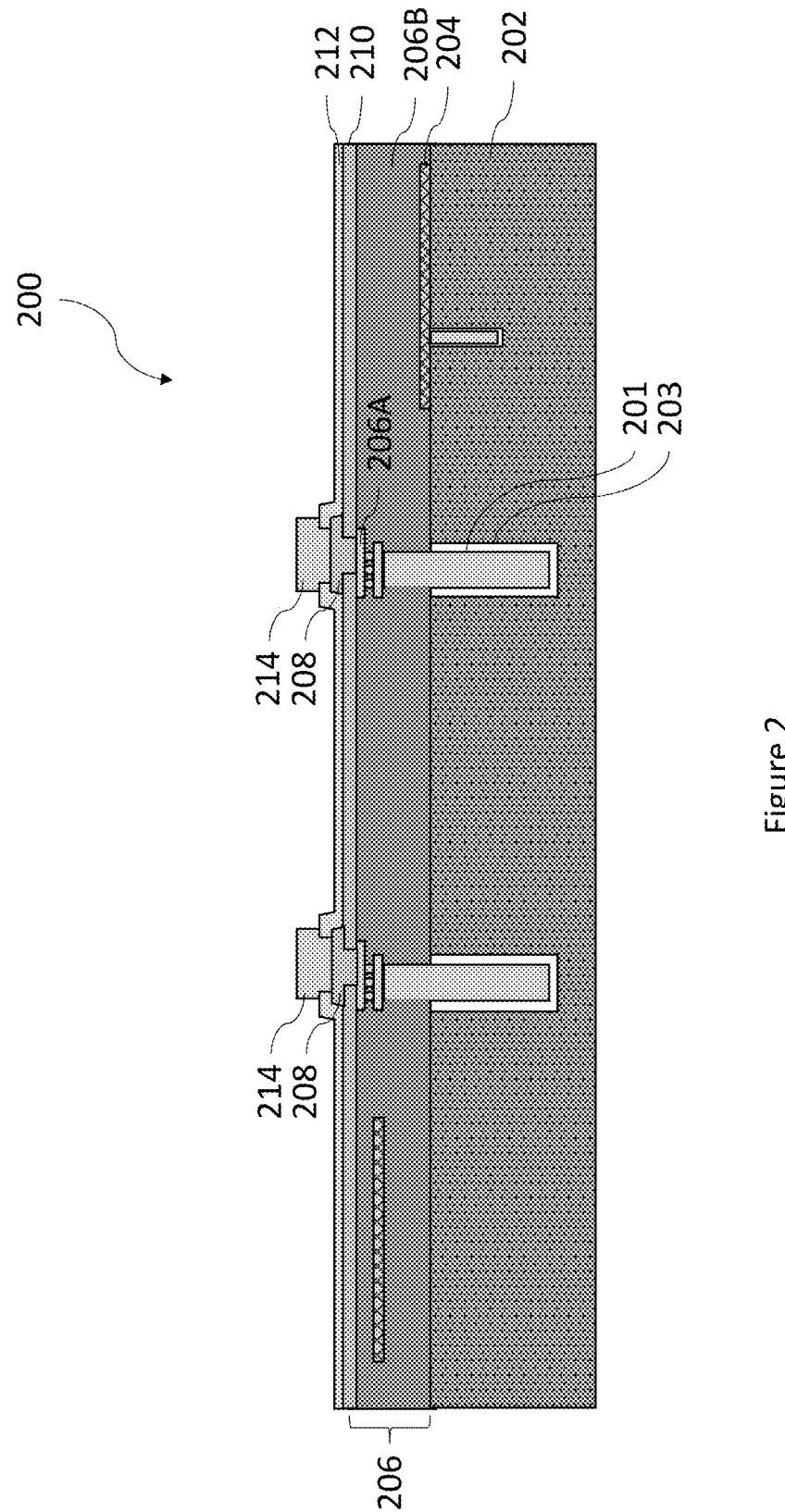

In FIG. 2, conductive connectors 214 are formed on the contact pads 208. The conductive connectors 214 may comprise a metal, like copper, titanium, tungsten, aluminum, or the like. As an example of forming the conductive connectors 214, a seed layer (not separately illustrated) may be deposited on exposed surfaces of the passivation layer 212, sidewalls of the passivation layer 212, and top surfaces of the contact pads 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, CVD, PVD, or the like. A photoresist (not shown) is formed and patterned on the seed layer. The photoresist may be formed by spin coating or the like and may be exposed to light for patterning. The pattern of the photoresist corresponds to the conductive connectors 214. The patterning forms one or more openings through the photoresist to expose the seed layer. A conductive material is formed in the openings of the photoresist and on the exposed portions of the seed layer by plating, such as electroplating or electroless plating, or the like. Then, the photoresist is removed by an acceptable ashing or stripping process, such as using an oxygen plasma or the like. Excess portions of the seed layer (e.g., portions not covered by the conductive material) may be removed by a etching process, and remaining portions of the seed layer and the conductive material correspond to the conductive connectors 214.

Figure 3:
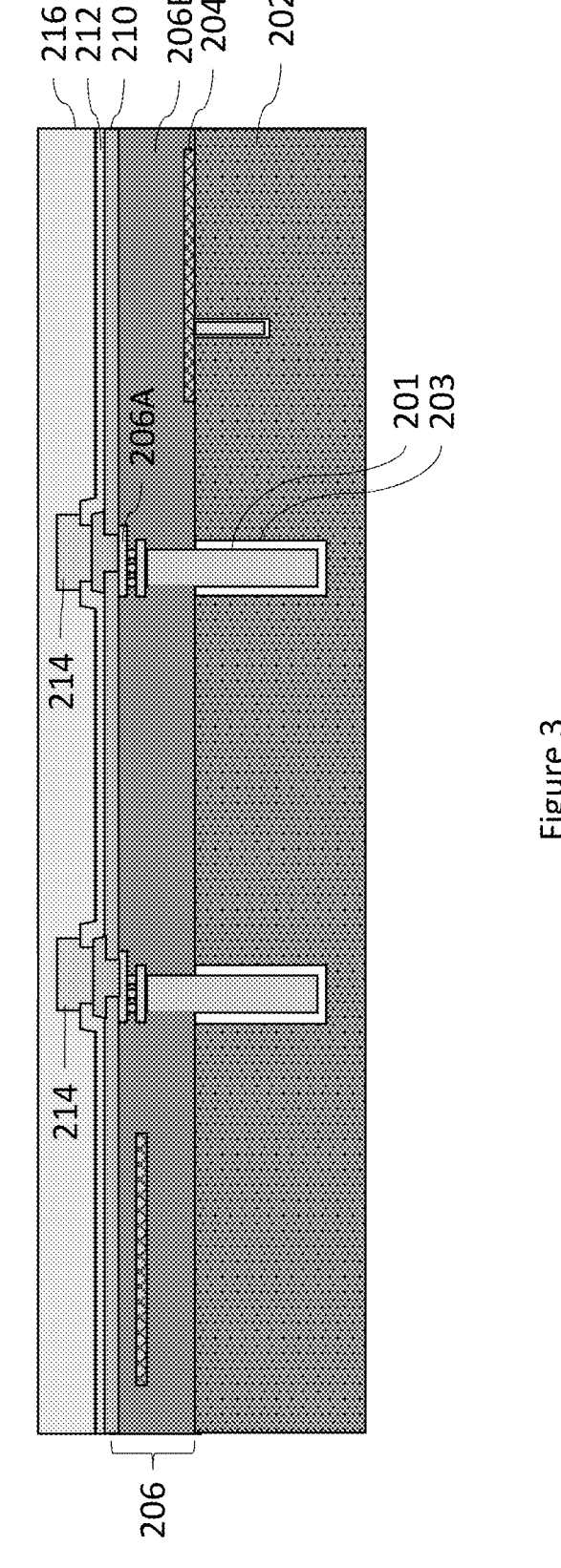

In FIG. 3, an insulating material 216 is deposited over the conductive connectors 214. In some embodiments, the insulating material 216 is formed of an organic material, such as a polymer, which may be a photo-sensitive material such as PBO, polyimide, BCB, or the like, that may be patterned using a lithography mask. In some embodiments, the insulating material 216 has a relatively low dielectric constant and a relatively low loss tangent. For example, a dielectric constant of the insulating material 216 may be less than about 3.5, and a loss tangent of the insulating material 216 may be less than 0.03. The insulating material 216 may have a lower loss tangent than a material of the dielectric layers 206B. The insulating material 216 may be formed by spin coating, lamination, CVD, the like, or a combination thereof. The insulating material 216 may cover the conductive connecters 214 such that a top surface of the insulating material 216 is above top surfaces of the conductive connectors 214.

Figure 4:
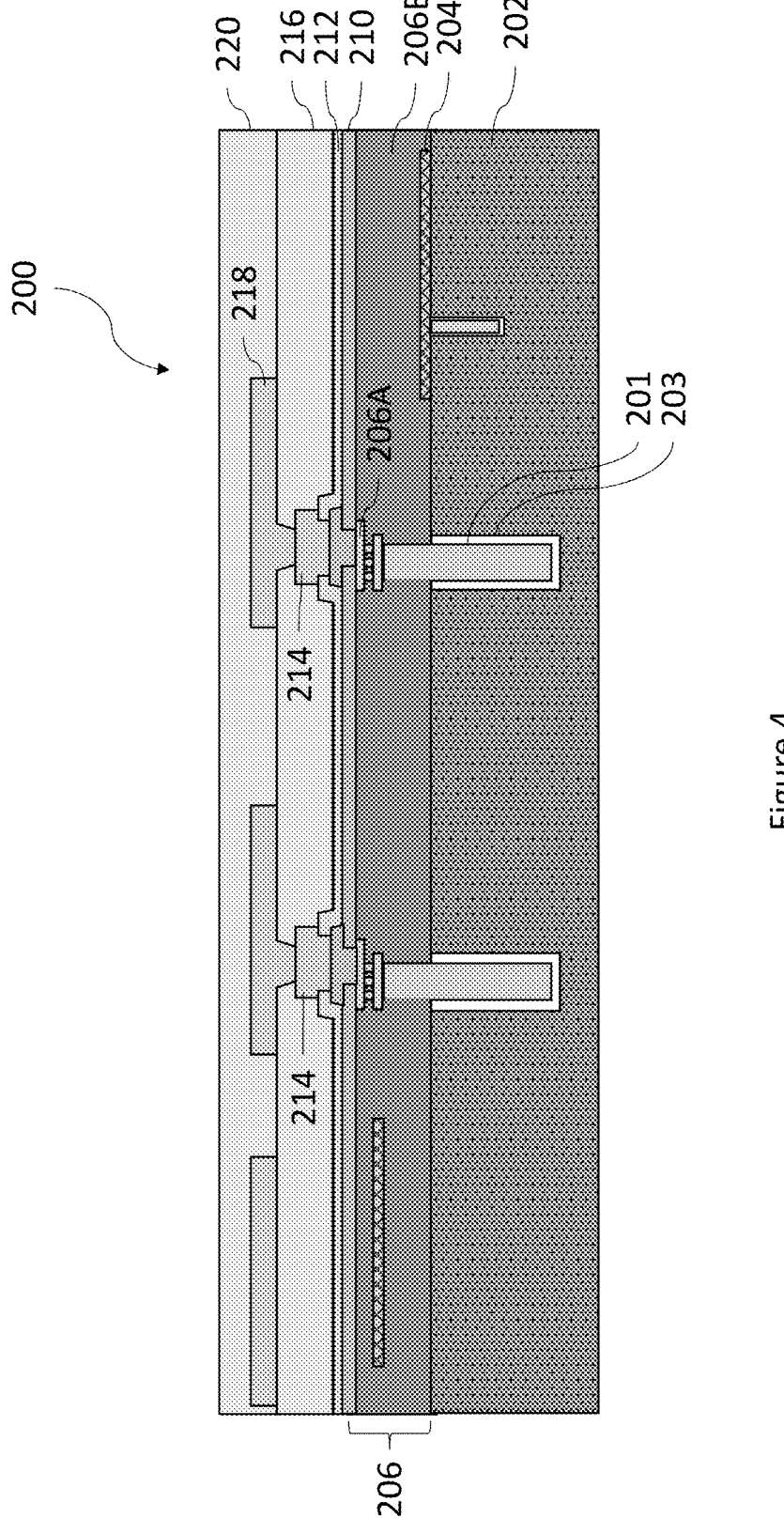

In FIG. 4, the insulating material 216 is then patterned to form openings exposing portions of the conductive connectors 214. The patterning may be formed by an acceptable process, such as by exposing the insulating material 216 to light when the insulating material 216 is a photo-sensitive material or by etching using, for example, an anisotropic etch. If the insulating material 216 is a photo-sensitive material, the insulating material 216 can be developed after the exposure.

The metallization pattern 218 is then formed. The metallization pattern 218 includes portions on and extending along the major surface of the insulating material 216. The metallization pattern 218 further includes portions extending through the insulating material 216 to physically and electrically couple the conductive connectors 214. The metallization pattern 218 may be formed using a different type of process than the damascene processes used to form the metallization patterns 206A in the interconnect structure 206. As an example to form the metallization pattern 218, a seed layer is formed over the insulating material 216 and in the openings extending through the insulating material 216. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 218. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 218. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The insulating material 220 is deposited on the metallization pattern 218 and the insulating material 216. The insulating material 220 may be formed in a manner similar to the insulating material 216, and may be formed of a similar material as the insulating material 216. For example, the insulating material 220 may comprise an organic material, which provides improved signal integrity and power integrity in the interposer 200.

Figure 5:
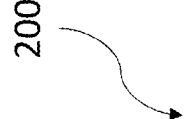

In FIG. 5, additional metallization layers are formed over the metallization pattern 218 to form a redistribution structure 240. The redistribution structure 240 includes organic insulating material layers 216, 220, 224, 228, 232, and 236; conductive connectors 214; and metallization patterns 218, 222, 226, 230, and 234. The metallization patterns may also be referred to as redistribution layers or redistribution lines. Each of the metallization pattern layers 222, 226, 230, and 234 may be formed of a substantially similar process and a substantially similar material as the metallization pattern 218 described above, and each of the organic insulating material layers 224, 228, 232, and 236 may be formed of a substantially similar process and a substantially similar material as the insulating material 216 described above. The metallization patterns 218, 222, 226, 230, and 234 collectively form functional circuitry providing, for example, signal and/or power routing to the underlying metallization patterns 206A, devices 204, and through vias 201. For example, each of the insulating materials 224, 228, 232, and 236 may have a relatively low loss tangent (e.g., lower than the dielectric layers 206B), which allows the redistribution structure 240 to provide good signal and power integrity in the interposer 200 even at relatively high operating frequencies.

Figure 6:

In FIG. 6, UBMs 242 are formed for external connection to the redistribution structure 240. The UBMs 242 have bump portions on and extending along the major surface of the insulating material 236, and have via portions extending through the insulating material 235 to physically and electrically couple the metallization pattern 234. As a result, the UBMs 242 are electrically coupled to the metallization patterns 206A and the through vias 201. The UBMs 242 may be formed of the same material as the metallization pattern 218. In some embodiments, the UBMs 242 have a different size than the metallization patterns 218, 222, 226, 230, and 234. Thus, an interposer 200 having relatively high signal integrity and power integrity is formed.

FIGS. 7 through 11 illustrate cross-sectional views of intermediate steps of forming an interposer 200' according to some embodiments. The interposer 200' may be similar to the interposer 200 where like reference numerals indicate like elements formed by like processes. However, the interposer 200' may be free of any contact pads 208 that connects the metallization patterns of the redistribution structure 240 to the metallization patterns of the interconnect structure 206 (see FIG. 11).

Figures 7, 8:
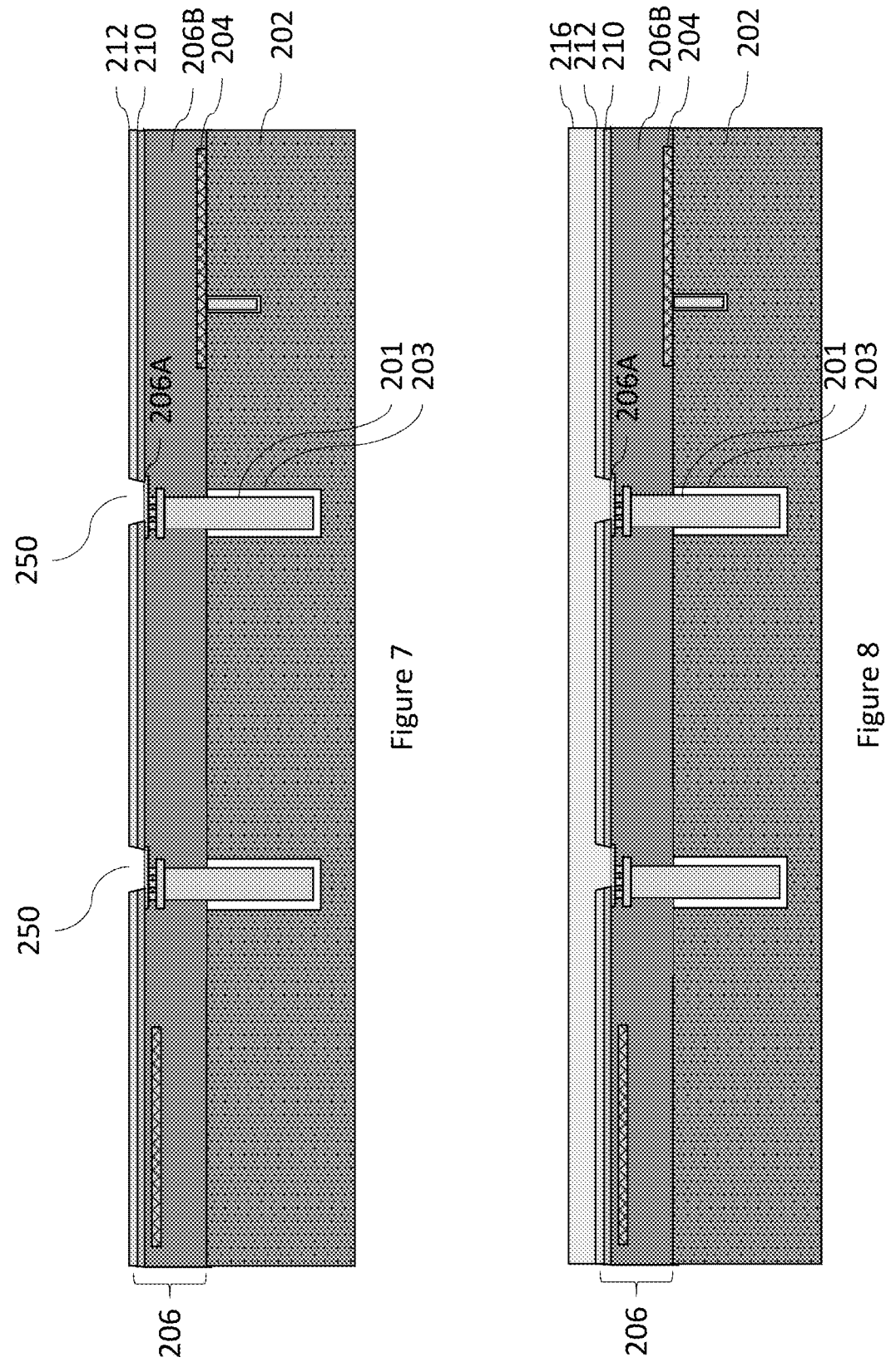
FIGS. 7 through 11 illustrate cross-sectional views of manufacturing an interposer according to some embodiments.

Specifically, referring to FIG. 7, no contact pads 208 are formed over the metallization patterns 206A of the interconnect structure 206. Rather, the passivation films 210 and 212 are patterned to include openings 250 which expose a topmost metallization pattern 206A of the interconnect structure 206. The passivation films 210 and 212 may be patterned using a combination of lithography and etching, for example.

Next, referring to FIG. 8, the insulating material 216 is deposited over a top surface of the passivation film 212 and in the openings 250. As a result, the insulating material 216 may extend through the passivation films 210 and 212 to a topmost metallization pattern 206A of the interconnect structure 206. In some embodiments, the insulating material 216 is formed of an organic material, such as a polymer, which may be a photo-sensitive material such as PBO, polyimide, BCB, or the like, that may be patterned using a lithography mask. In some embodiments, the insulating material 216 has a relatively low dielectric constant and a relatively low loss tangent. For example, a dielectric constant of the insulating material 216 may be less than about 3.5, and a loss tangent of the insulating material 216 may be less than about 0.03. The insulating material 216 may have a lower loss tangent than a material of the dielectric layers 206B. The insulating material 216 may be formed by spin coating, lamination, CVD, the like, or a combination thereof.

Figures 9, 10:
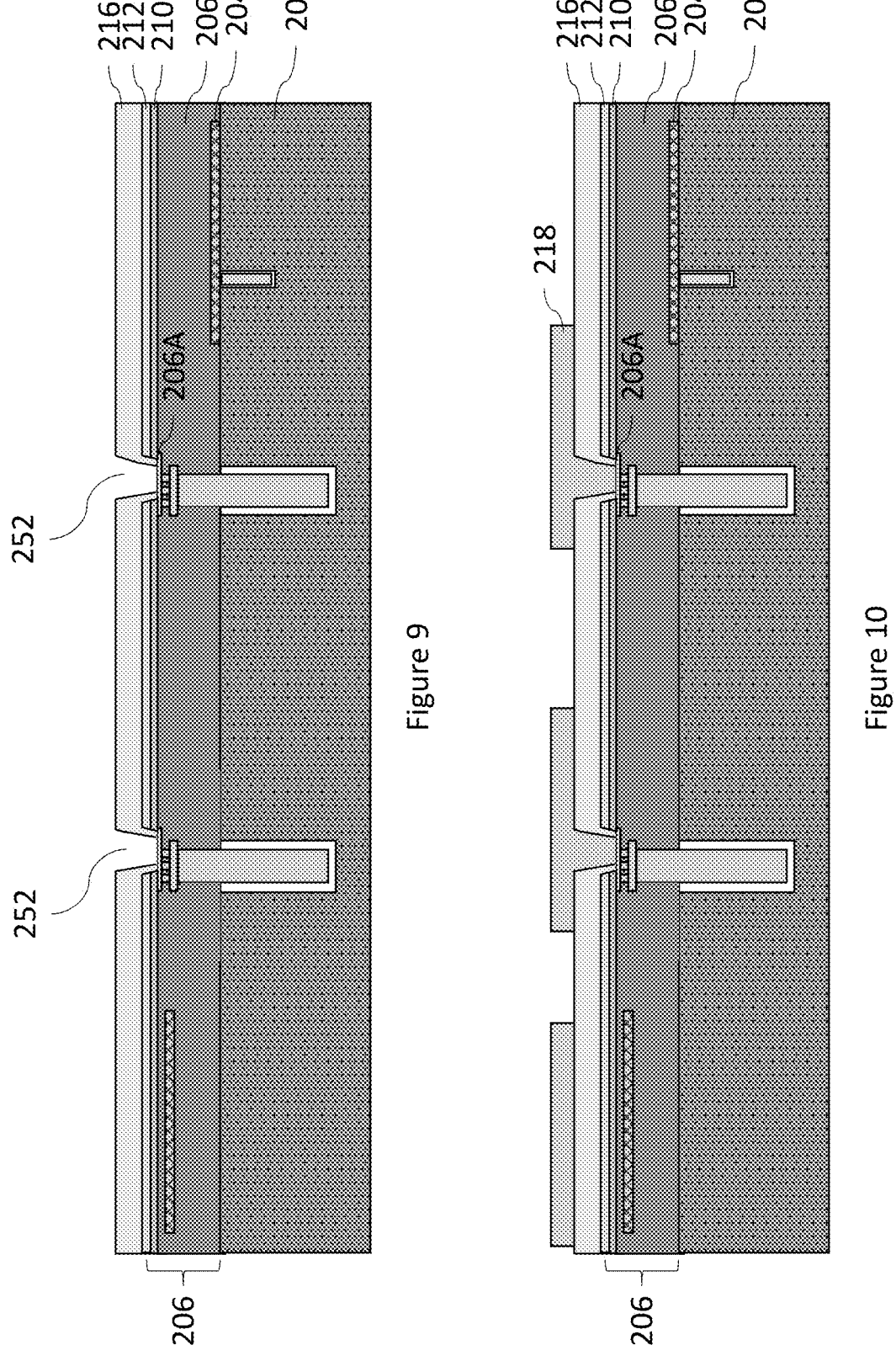

In FIG. 9, the insulating material 216 is then patterned to form openings 252 exposing portions of the topmost metallization pattern 206A of the interconnect structure 206. The patterning may be formed by an acceptable process, such as by exposing the insulating material 216 to light when the insulating material 216 is a photo-sensitive material or by etching using, for example, an anisotropic etch. If the insulating material 216 is a photo-sensitive material, the insulating material 216 can be developed after the exposure.

The metallization pattern 218 is then formed in FIG. 10. The metallization pattern 218 includes portions on and extending along the major surface of the insulating material 216. The metallization pattern 218 further includes portions extending through the insulating material 216 to physically and electrically couple the topmost metallization pattern 206A of the interconnect structure 206. As an example to form the metallization pattern 218, a seed layer is formed over the insulating material 216 and in the openings extending through the insulating material 216. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 218. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 218. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 11:
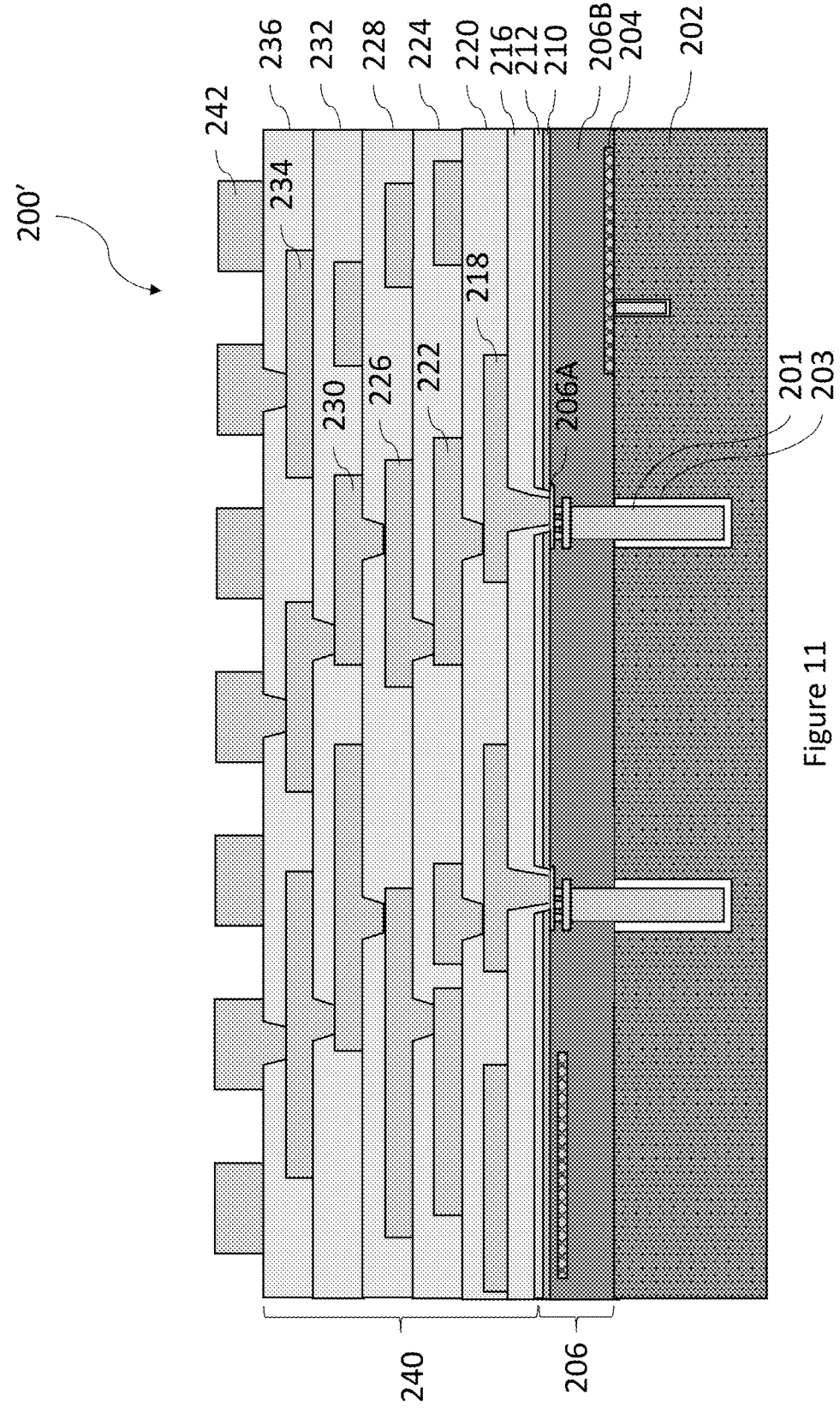

In FIG. 11, additional metallization layers are formed over the metallization pattern 218 to form a redistribution structure 240 in the interposer 200'. The redistribution structure 240 includes organic insulating material layers 216, 220, 224, 228, 232, and 236 and metallization patterns 218, 222, 226, 230, and 234. The metallization patterns may also be referred to as redistribution layers or redistribution lines. Each of the metallization pattern layers 222, 226, 230, and 234 may be formed of a substantially similar process and a substantially similar material as the metallization pattern 218 described above, and each of the organic insulating material layers 224, 228, 232, and 236 may be formed of a substantially similar process and a substantially similar material as the insulating material 216 described above. The metallization patterns 218, 222, 226, 230, and 234 collectively form functional circuitry providing, for example, signal and/or power routing to the underlying metallization patterns 206A, devices 204, and through vias 201. For example, each of the insulating materials 224, 228, 232, and 236 may have a relatively low loss tangent (e.g., lower than the dielectric layers 206B), which allows the redistribution structure 240 to provide good signal and power integrity in the interposer 200 even at relatively high operating frequencies. In the interposer 200', the metallization patterns 218, 222, 226, 230, and 234 of the redistribution structure 240 are directly coupled with the metallization patterns 206A of the interconnect structure 206 without any intervening contact pads or conductive connectors.

The redistribution structure 240 is shown as an example having five layers of metallization patterns in the interposer 200'. More or fewer layers of insulating material layers and metallization pattern layers may be formed in the redistribution structure 240. If fewer insulating material layers and metallization pattern layers are to be formed, steps and process discussed herein may be omitted. If more insulating material layers and metallization pattern layers are to be formed, steps and processes discussed herein may be repeated.

Figure 12:
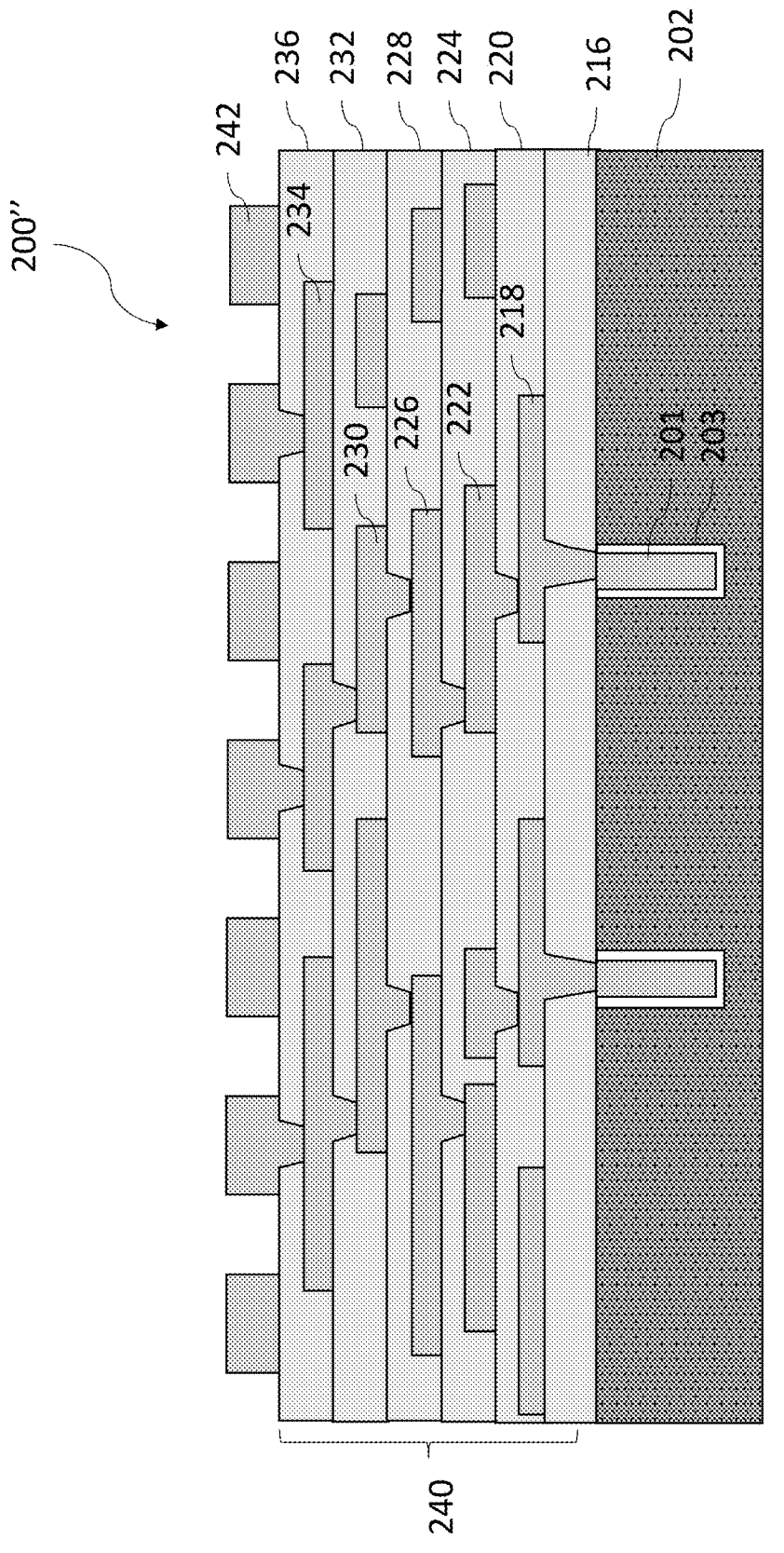
FIG. 12 illustrates a cross-section view of an interposer according to some embodiments.

FIG. 12 illustrates a cross-sectional view of an interposer 200" in accordance with some embodiments. The interposer 200" may be similar to the interposer 200 where like reference numerals indicate like elements formed by like processes. As illustrated, the interposer 200" excludes the interconnect structure 206. For example, the interposer 200" may be free of any metallization patterns formed by damascene process and may further be free of any insulating layers formed of inorganic materials. Rather, in the interposer 200", the redistribution structure 240 may formed directly on the substrate 202 such that the lowest-most metallization pattern 218 of the redistribution structure 240 may be directly coupled to the through vias 201 in the substrate 202. The redistribution structure 240 includes organic insulating material layers 216, 220, 224, 228, 232, and 236 and metallization patterns 218, 222, 226, 230, and 234. The inclusion of organic insulating materials provides good signal integrity and power integrity at relatively high operating frequencies. As illustrated by FIG. 12, the inclusion of the interconnect structure 206 (e.g., comprising the passivation films 210 and 212, the dielectric layers 206B, and the metallization patterns 206A) is optional.

The redistribution structure 240 is shown as an example having five layers of metallization patterns in the interposer 200". More or fewer layers of insulating material layers and metallization pattern layers may be formed in the redistribution structure 240. If fewer insulating material layers and metallization pattern layers are to be formed, steps and process discussed herein may be omitted. If more insulating material layers and metallization pattern layers are to be formed, steps and processes discussed herein may be repeated.

FIGS. 13 through 18 illustrate cross-sectional views of applying further processing steps to package the interposer 200 in accordance with some embodiments. Although the interposer 200 is illustrated, it should be understood that the process steps of FIGS. 13 through 18 may be applied to package the interposer 200' of FIG. 11 and/or the interposer 200" of FIG. 12 as well.

Figures 13, 14:
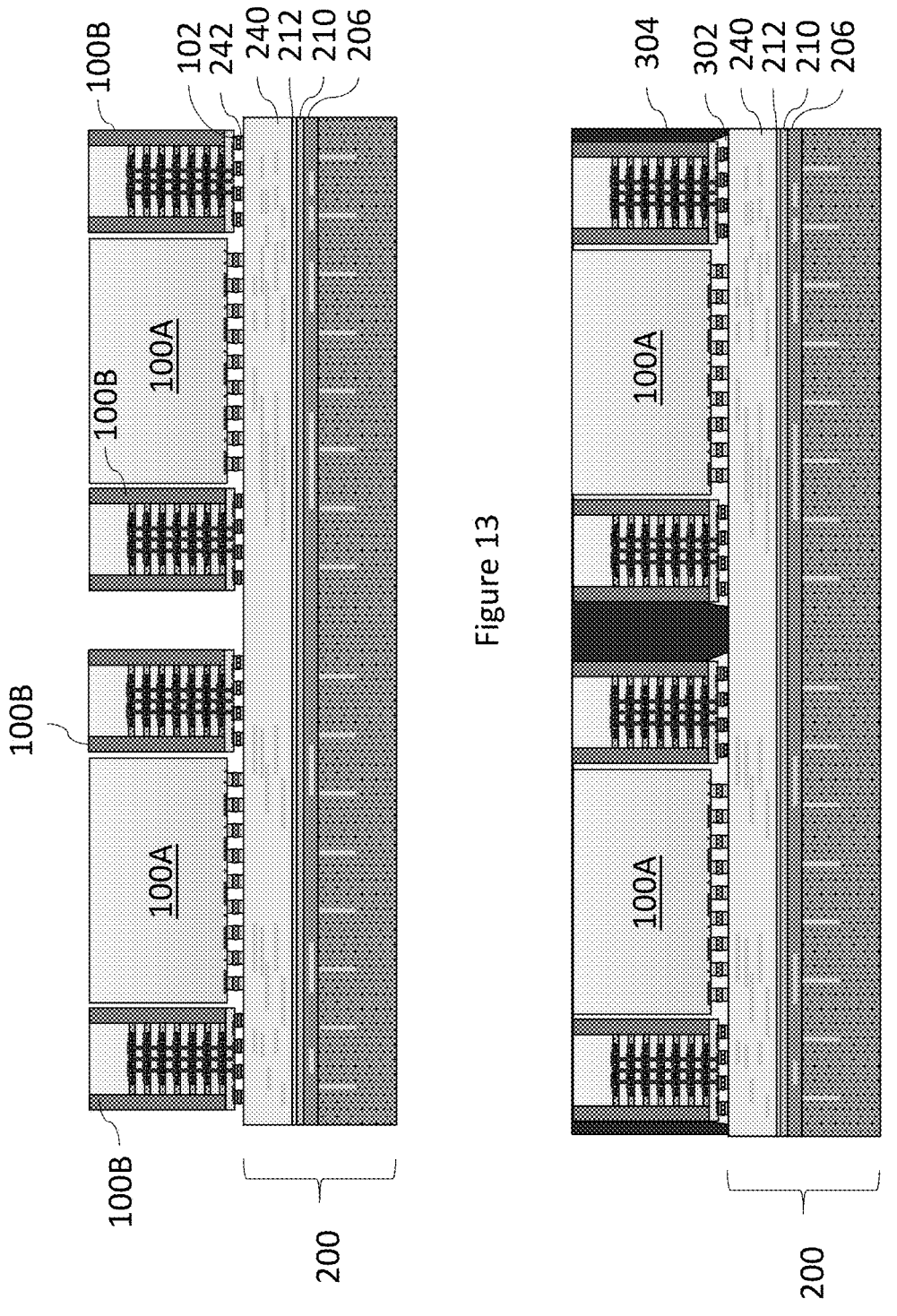
FIGS. 13 through 18 illustrate cross-sectional views of manufacturing a semiconductor package with an interposer according to some embodiments.

In FIG. 13, integrated circuit dies 100 (e.g., a first integrated circuit die 100A and a plurality of second integrated circuit dies 100B) are attached to the interposer 200. The integrated circuit dies 100 may be similar to the interposer 200 in FIG. 1 with the integrated circuit dies 100 including active devices that are interconnected together by an interconnect structure to form functional circuits. In the embodiment shown, multiple integrated circuit dies 100 are placed adjacent one another, including the first integrated circuit die 100A and the second integrated circuit dies 100B, where the first integrated circuit die 100A is between the second integrated circuit dies 100B. In some embodiments, the first integrated circuit die 100A is a logic device, such as a CPU, GPU, or the like, and the second integrated circuit dies 100B are memory devices, such as DRAM dies, HMC modules, HBM modules, or the like. In some embodiments, the first integrated circuit die 100A is the same type of device (e.g., SoCs) as the second integrated circuit dies 100B. The integrated circuit dies 100 may be attached to a front side of the interposer 200 such that the interconnect structure 206 and the redistribution structure 240 are each between the semiconductor substrate 200 and the dies 100.

In the illustrated embodiment, the integrated circuit dies 100 are attached to the interposer 200 with solder bonds, such as conductive connectors 102 on the UBMs 242 of the interposer 200. The integrated circuit dies 100 may be placed on the interconnect structure 240 using, e.g., a pick-and-place tool. The conductive connectors 102 may be formed of a conductive material that is reflowable, such as solder, copper, aluminum, gold, nickel, silver, palladium, tin, the like, or a combination thereof. In some embodiments, the conductive connectors 102 are formed by initially forming a layer of solder through methods such as evaporation, electroplating, printing, solder transfer, ball placement, or the like. Once a layer of solder has been formed on the structure, a reflow may be performed in order to shape the conductive connectors 102 into desired bump shapes. Attaching the integrated circuit dies 100 to the interposer 200 may include placing the integrated circuit dies 100 on the interposer 200 and reflowing the conductive connectors 102. The conductive connectors 102 form joints between UBMs 242 of the interposer 200 and the conductive connectors 102 of the integrated circuit dies 100, electrically connecting the interposer 200 to the integrated circuit dies 100.

In FIG. 14, an underfill 302 may be formed around the conductive connectors 102, and between the interposer 200 and the integrated circuit dies 100. The underfill 302 may reduce stress and protect the joints resulting from the reflowing of the conductive connectors 102. The underfill 302 may be formed of an underfill material such as a molding compound, epoxy, or the like. The underfill 302 may be formed by a capillary flow process after the integrated circuit dies 100 are attached to the interposer 200, or may be formed by a suitable deposition method before the integrated circuit dies 100 are attached to the interposer 200. The underfill 302 may be applied in liquid or semi-liquid form and then subsequently cured.

In other embodiments (not separately illustrated), the integrated circuit dies 100 are attached to the interposer 200 with direct bonds. For example, fusion bonding, direct dielectric-to-dielectric bonding, direct metal-to-metal bonding, combinations thereof or the like may be used to directly bond corresponding dielectric layers and/or die connectors of the integrated circuit dies 100 and the interposer 200 without the use of adhesive or solder. The underfill 302 may be omitted when direct bonding is used. Further, a mix of bonding techniques could be used, e.g., some integrated circuit dies 100 could be attached to the interposer 200 by solder bonds, and other integrated circuit dies 100 could be attached to the interposer 200 by direct bonds.

Further in FIG. 14, an encapsulant 304 is formed on and around the integrated circuit dies 100. After formation, the encapsulant 304 encapsulates the integrated circuit dies 100, and the underfill 302 (if present) or the conductive connectors 102. The encapsulant 304 may be a molding compound, epoxy, or the like. The encapsulant 304 may be applied by compression molding, transfer molding, or the like, and is formed over the interposer 200 such that the integrated circuit dies 100 are buried or covered. The encapsulant 304 may be applied in liquid or semi-liquid form and then subsequently cured. The encapsulant 304 may be thinned to expose the integrated circuit dies 100. The thinning process may be a grinding process, a chemical-mechanical polish (CMP), an etch-back, combinations thereof, or the like. After the thinning process, the top surfaces of the integrated circuit dies 100 and the encapsulant 304 are coplanar (within process variations) such that they are level with one another. The thinning is performed until a desired amount of the integrated circuit dies 100 and/or the encapsulant 304 has been removed.

Figures 15, 16:
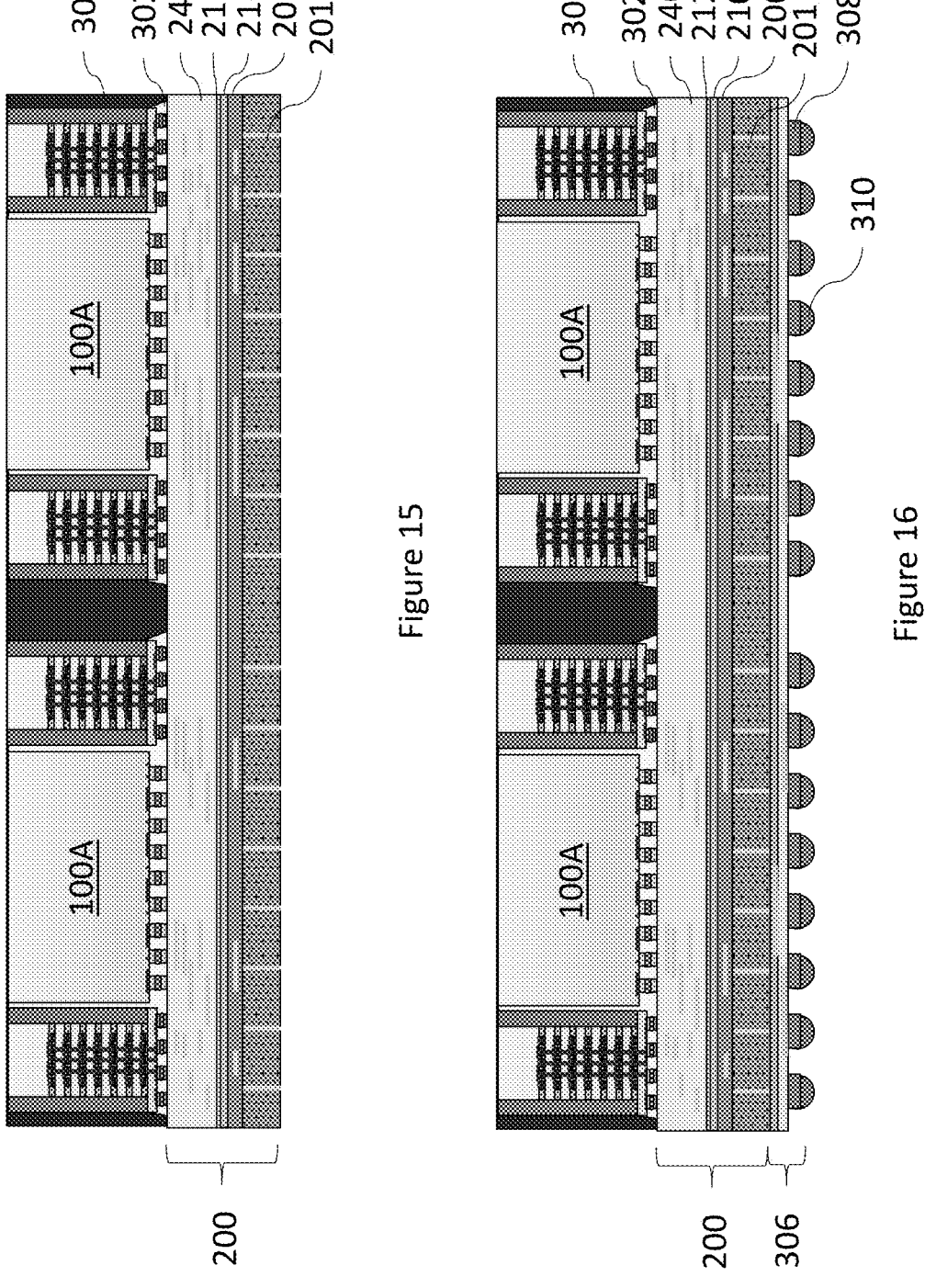

In FIG. 15, a backside the substrate 202 is thinned to expose the through vias 201. Exposure of the through vias 201 may be accomplished by a thinning process, such as a grinding process, a chemical-mechanical polish (CMP), an etch-back, combinations thereof, or the like. In some embodiments (not separately illustrated), the thinning process for exposing the through vias 201 includes a CMP, and the through vias 201 protrude at the back-side of the interposer 200 as a result of dishing that occurs during the CMP. In such embodiments, an insulating layer (not separately illustrated) may optionally be formed on the back surface of the substrate 202, surrounding the protruding portions of the through vias 201. The insulating layer may be formed of a silicon-containing insulator, such as, silicon nitride, silicon oxide, silicon oxynitride, or the like, and may be formed by a suitable deposition method such as spin coating. CVD, plasma-enhanced CVD (PECVD), high density plasma CVD (HDP-CVD), or the like. After the substrate 202 is thinned, the exposed surfaces of the through vias 201 and the insulating layer (if present) or the substrate 202 are coplanar (within process variations) such that they are level with one another, and are exposed at the back-side of the interposer 200.

In FIG. 16, a backside redistribution structure 306 and UBMs 308 are formed on the exposed surfaces of the through vias 201 and the substrate 202. The redistribution structure 306 may be formed of similar materials and processes as the redistribution structure 240, described above. For example, the redistribution structure 306 may comprise one or more metallization layers in organic insulting materials. Further the UBMs 308 may be formed of similar materials and processes as the UBMs 242, described above.

Conductive connectors 310 are formed on the UBMs 308. The conductive connectors 310 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 310 may include a conductive material such as solder, copper, aluminum, gold, nickel, silver, palladium, tin, the like, or a combination thereof. In some embodiments, the conductive connectors 310 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 310 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figures 17, 18:
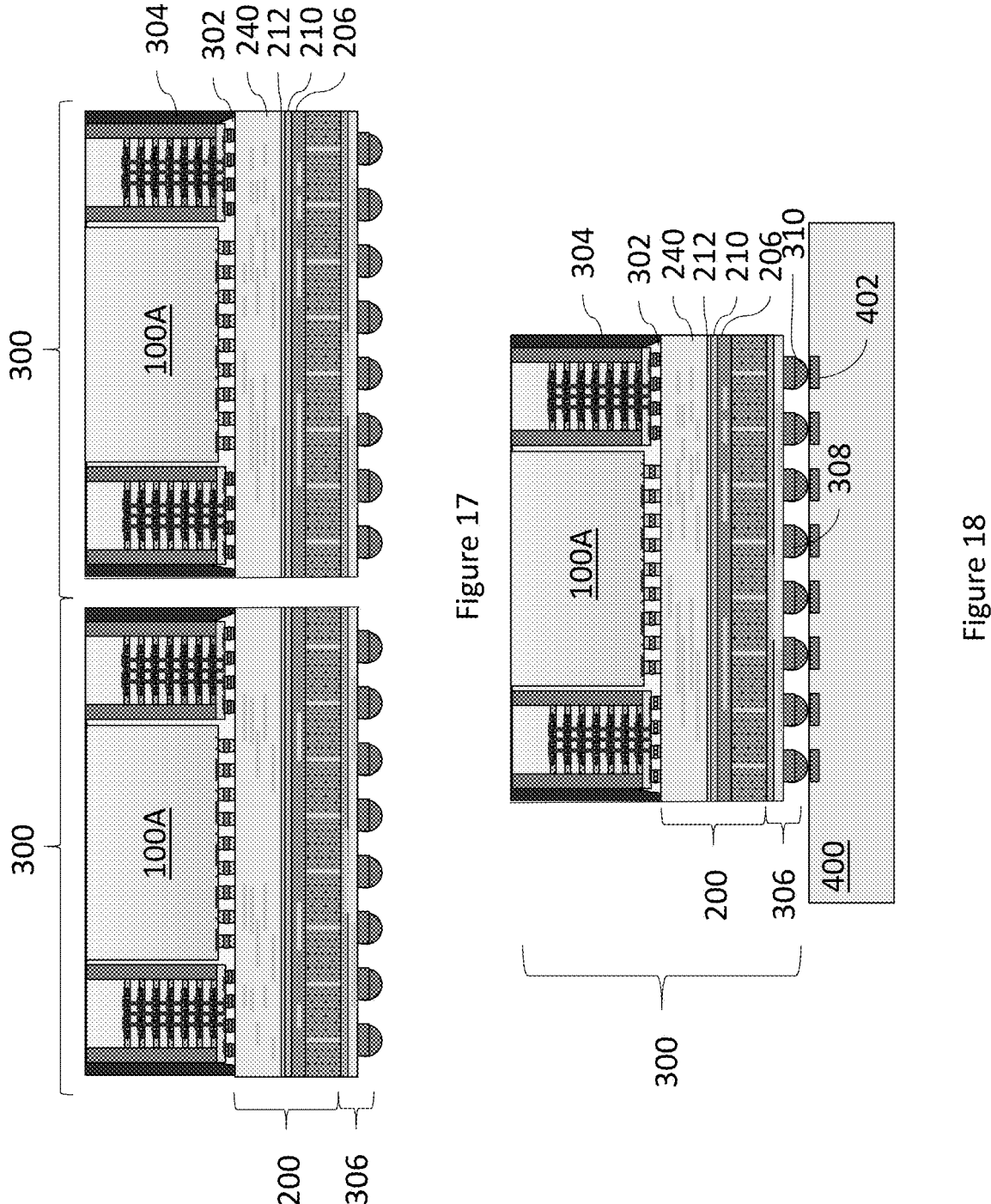

Next in FIG. 17, a singulation process is performed by cutting along scribe line regions. The singulation process may include sawing, dicing, or the like. For example, the singulation process can include sawing the encapsulant 304, the redistribution structure 240, the interconnect structure 206, and the substrate 202. The singulation process singulates each package 300 from adjacent packages 300. The singulation process forms interposers 200 from the singulated portions of the interposer wafer. As a result of the singulation process, the outer sidewalls of the interposer 200 (including the interconnect structure 206, the passivation layers 210/212, and the redistribution structure 240) and the encapsulant 304 are laterally coterminous (within process variations). Further the encapsulant 304 may completely surround the integrated circuit dies 100 in a plan view.

In FIG. 18, the package 300 will be attached to a package substrate 400, thus completing formation of the integrated circuit package. A single package component 300, a single package substrate 400, and a single integrated circuit package are illustrated. It should be appreciated that multiple package components can be simultaneously processed to form multiple integrated circuit packages.

The package 300 is attached to a package substrate 400 using the conductive connectors 310. In some embodiments, the package substrate 400 includes a substrate core, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core may be a SOI substrate. Generally, an SOI substrate includes a layer of a semiconductor material such as epitaxial silicon, germanium, silicon germanium, SOI, SGOI, or combinations thereof. In another embodiment, the substrate core is an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate core.

The substrate core may include active and passive devices (not separately illustrated). Devices such as transistors, capacitors, resistors, combinations thereof, and the like may be used to generate the structural and functional requirements of the design for the system. The devices may be formed using any suitable methods.

The substrate core may also include metallization layers and vias, and bond pads 402 over the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material, and may be formed through any suitable process (such as deposition, damascene, or the like). In some embodiments, the substrate core is substantially free of active and passive devices.

The conductive connectors 310 are reflowed to attach the UBMs 308 to the bond pads 402. The conductive connectors 310 connect the interposer 200, including the metallization patterns of the redistribution structure 240 and the metallization patterns of the interconnect structure 206, to the package substrate 400, including metallization layers of the substrate core. Thus, the package substrate 400 is electrically connected to the integrated circuit dies 100. In some embodiments, passive devices (e.g., surface mount devices (SMDs), not separately illustrated) may be attached to the interposer 200 (e.g., bonded to the UBMs 308) prior to mounting on the package substrate 400. In such embodiments, the passive devices may be bonded to a same surface of the package 300 as the conductive connectors 310. In some embodiments, passive devices (e.g., SMDs, not separately illustrated) may be attached to the package substrate 400, e.g., to the bond pads 402.

In some embodiments, an underfill (not separately illustrated) is formed between the package 300 and the package substrate 400, surrounding the conductive connectors 310. The underfill may be formed by a capillary flow process after the package 300 is attached or may be formed by any suitable deposition method before the package component 300 is attached. The underfill may be a continuous material extending from the package substrate 400 to the redistribution structure 306.

FIGS. 13 through 18 illustrate manufacturing steps for packaging the interposer 200 while it is part of a wafer and prior to performing a singulation process on the interposer 200. FIGS. 19 through 25 illustrate cross-sectional views of various intermediary steps of applying further processing steps to package the interposer 200 in accordance with some embodiments. In FIGS. 19 through 25, the interposer 200 is packaged after it is singulated and separated from other interposers in a wafer. Although the interposer 200 is illustrated, it should be understood that the process steps of FIGS. 19 through 25 may be applied to package the interposer 200' of FIG. 11 and/or the interposer 200" of FIG. 12 as well.

Figures 19, 20:
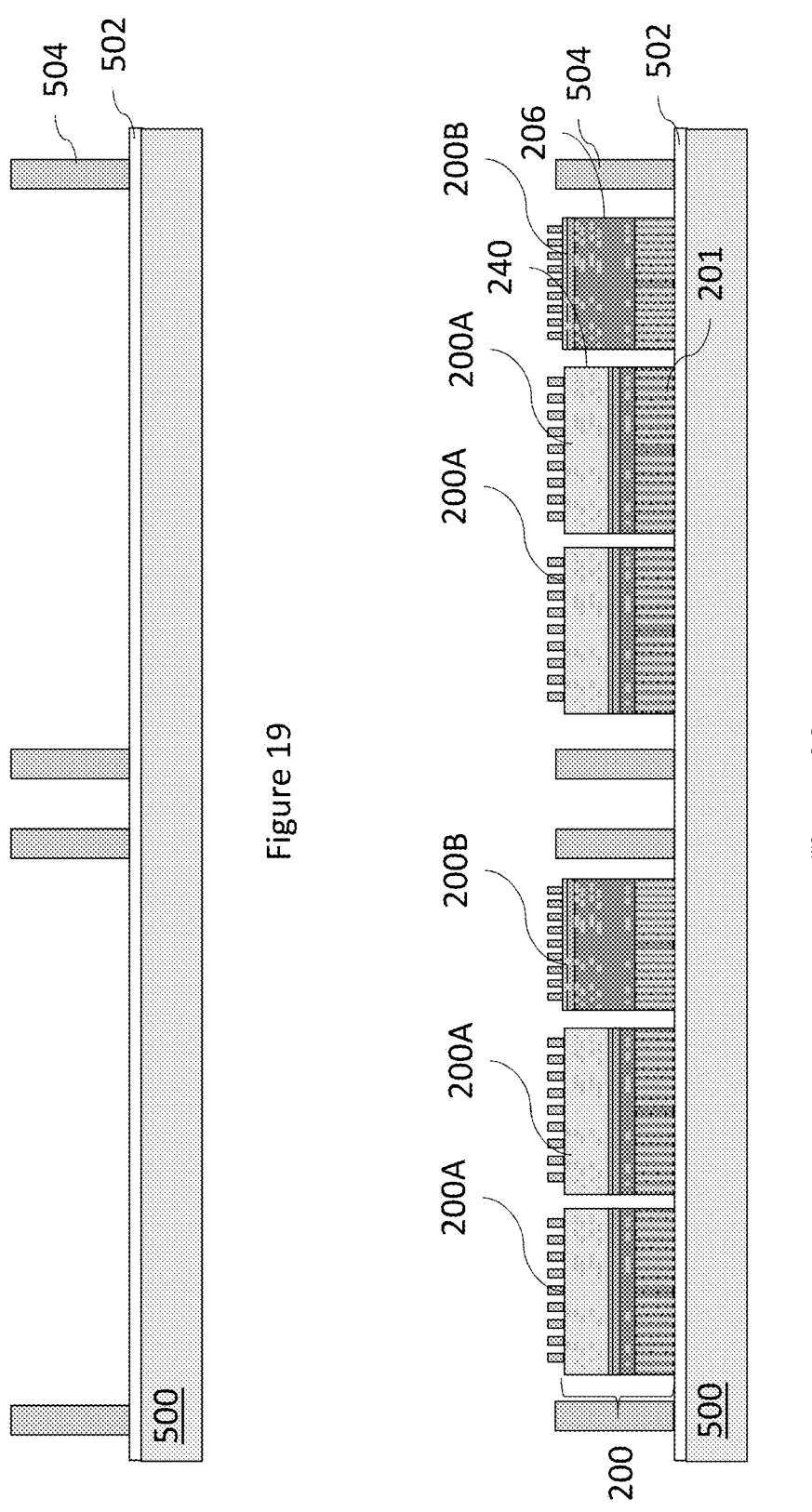
FIGS. 19 through 25 illustrate cross-sectional views of manufacturing a semiconductor package with an interposer according to some embodiments.

In FIG. 19, a carrier substrate 500 is provided, and a release layer 502 is formed on the carrier substrate 500. The carrier substrate 500 may be a glass carrier substrate, a ceramic carrier substrate, or the like. The carrier substrate 500 may be a wafer, such that multiple packages can be formed on the carrier substrate 500 simultaneously.

The release layer 502 may be formed of a polymer-based material, which may be removed along with the carrier substrate 500 from the overlying structures that will be formed in subsequent steps. In some embodiments, the release layer 502 is an epoxy-based thermal-release material, which loses its adhesive property when heated, such as a light-to-heat-conversion (LTHC) release coating. In other embodiments, the release layer 502 may be an ultra-violet (UV) glue, which loses its adhesive property when exposed to UV lights. The release layer 502 may be dispensed as a liquid and cured, may be a laminate film laminated onto the carrier substrate 500, or may be the like. The top surface of the release layer 502 may be leveled and may have a high degree of planarity.

Through vias 504 are formed on the carrier substrate 500. As an example to form the through vias 504, a seed layer (not shown) is formed over the carrier substrate 500 and on the release layer 502. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 504.

In FIG. 20, singulated interposers 200 (labelled 200A and 200B) are adhered to the release layer 502 by an adhesive (not separately illustrated). Each of the interposers 200 may be singulated, and a planarization process (e.g., a CMP process, an etch back process, and/or the like) may be applied to a backside of the interposers 200 to expose the through vias 201 prior to the interposers 200 being attached to the carrier substrate 500. A desired type and quantity of the interposers 200 are adhered to each region of the carrier substrate 500. In the embodiment shown, multiple interposers 200 are adhered adjacent one another, including the interposers 200A and the interposers 200B. The interposers 200A may include redistribution structures 240 having organic insulating layers (e.g., as described above in FIG. 1 through 12) whereas the interposers 200B may be free of any redistribution structures having organic insulating layers. Rather, the interposers 200B may only include interconnect structure 206, and all the metallization patterns in the interposer 200B may be formed by damascene processes. In some embodiments, the interposers 200A may be referred to as local silicon interconnect (LSI) dies, and the interposers 200B may be referred to a local redistribution layer interconnect (LRI) dies. The interposers 200A and 200B may have different sizes (e.g., different heights and/or surface areas), or may have the same size (e.g., same heights and/or surface areas).

Figures 21, 22:
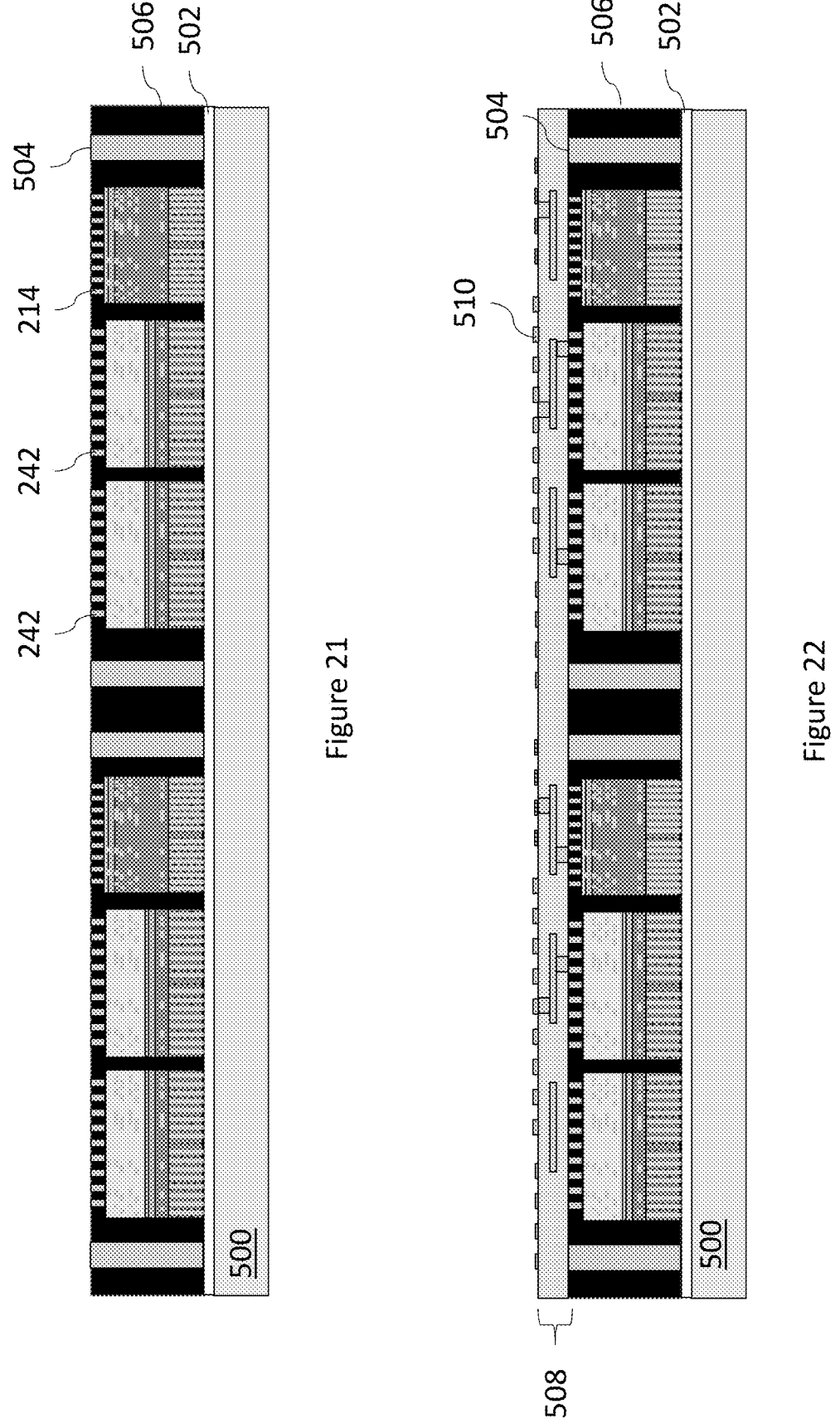

In FIG. 21, an encapsulant 506 is formed on and around the various components. After formation, the encapsulant 506 encapsulates the through vias 504 and the interposers 200. The encapsulant 506 may be a molding compound, epoxy, or the like. The encapsulant 506 may be applied by compression molding, transfer molding, or the like, and may be formed over the carrier substrate 500 such that the through vias 504 and/or the interposers 200 are buried or covered. The encapsulant 506 is further formed in gap regions between the interposers 200. The encapsulant 506 may be applied in liquid or semi-liquid form and then subsequently cured.

The encapsulant 506 may be initially deposited to bury the interposers 200 and the through vias 504. A planarization process is performed on the encapsulant 506 to expose the through vias 504, the UBMs 242 of the interposers 200A, and the conductive connectors 214 of the interposers 200B. Top surfaces of the through vias 504, the UBMs 242, the conductive connectors 214, and encapsulant 506 are substantially coplanar after the planarization process within process variations. The planarization process may be, for example, a CMP, a grinding process, or the like.

In FIG. 22, a redistribution structure 508 is formed over the interposers 200, the through vias 504, and the encapsulant 506, and UBMs 510 may be formed over the redistribution structure 508. The redistribution structure 508 may be formed of similar materials and processes as the redistribution structure 240, described above. For example, the redistribution structure 508 may comprise one or more metallization layers in organic insulating materials. Further, the UBMs 510 may be formed of similar materials and processes as the UBMs 242, described above. In some embodiments, the UBMs 510 may each be of a uniform size. In other embodiments (as illustrated), the UBMs 510 may be different sizes to accommodate the placement of different types of dies and/or die stacks over the UBMs 510.

Figure 23:
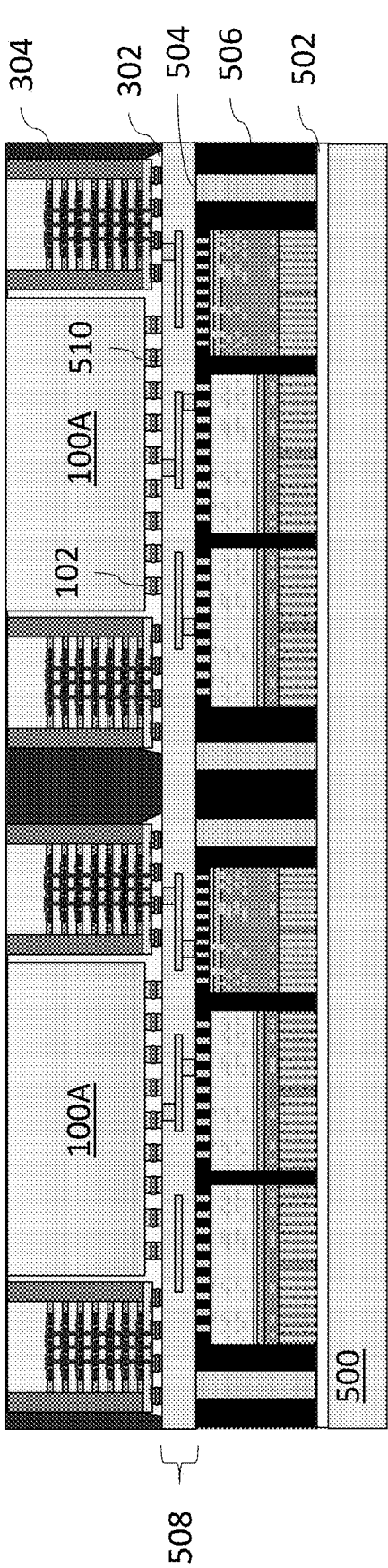

In FIG. 23, integrated circuit dies 100 (e.g., a first integrated circuit die 100A and a plurality of second integrated circuit dies 100B) are attached to the redistribution structure 508. The integrated circuit dies 100 may be similar to the interposer 200 in FIG. 1 with the integrated circuit dies 100 including active devices that are interconnected together by an interconnect structure to form functional circuits. In the embodiment shown, multiple integrated circuit dies 100 are placed adjacent one another, including the first integrated circuit die 100A and the second integrated circuit dies 100B, where the first integrated circuit die 100A is between the second integrated circuit dies 100B. In some embodiments, the first integrated circuit die 100A is a logic device, such as a CPU, GPU, or the like, and the second integrated circuit dies 100B are memory devices, such as DRAM dies, HMC modules, HBM modules, or the like. In some embodiments, the first integrated circuit die 100A is the same type of device (e.g., SoCs) as the second integrated circuit dies 100B. In the illustrated embodiment, the integrated circuit dies 100 are attached to the redistribution structure 508 with solder bonds, such as conductive connectors 102 on the UBMs 510, in a similar manner as described above. Thus, the redistribution structure 508 may electrically connect the integrated circuit dies 100 to the interposers 200 and the through vias 504. In other embodiments, the integrated circuit dies 100 may be attached to the redistribution structure 508 using a different bonding method. An underfill 302 may be formed around the conductive connectors 102, and an encapsulant 304 is formed on and around the integrated circuit dies 100 as described above.

Figure 24:
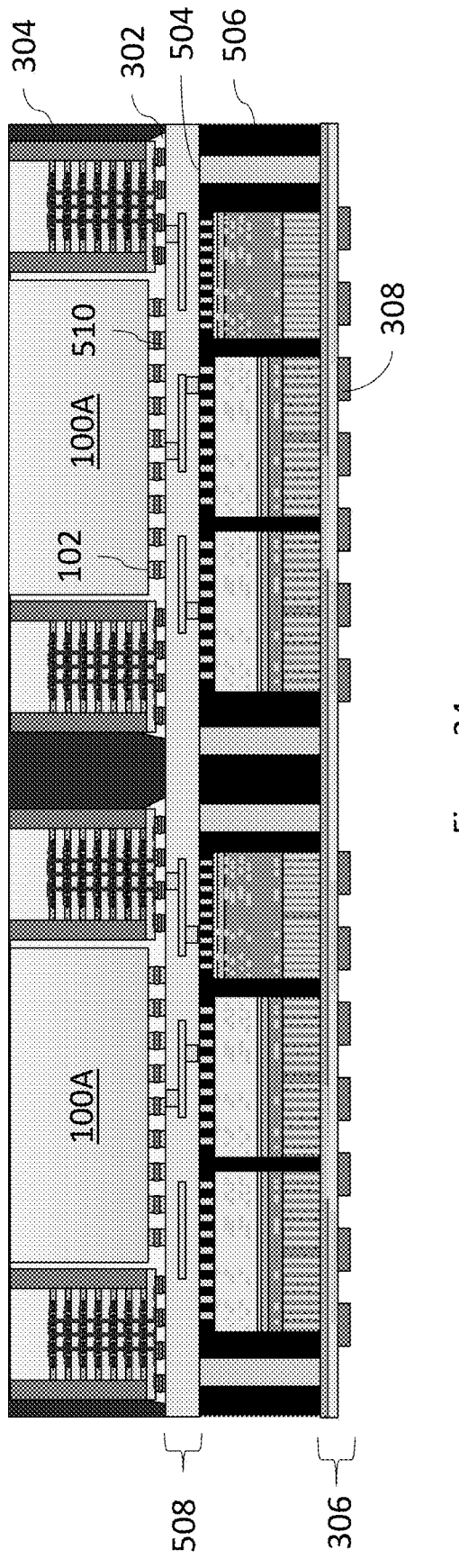

In FIG. 24, a carrier substrate de-bonding is performed to detach (or "de-bond") the carrier substrate 500 from the interposers 200 and the encapsulant 506. In accordance with some embodiments, the de-bonding includes projecting a light such as a laser light or an UV light on the release layer 502 so that the release layer 502 decomposes under the heat of the light and the carrier substrate 500 can be removed. The structure is then flipped over and placed on a tape (not shown). After the carrier substrate 500 is removed, a backside redistribution structure 306 and UBMs 308 are formed on the exposed surfaces of the interposers 200 and the through vias 504. The redistribution structure 306 may be formed of similar materials and processes as the redistribution structure 240, described above. For example, the redistribution structure 306 may comprise one or more metallization layers in organic insulting materials. Further the UBMs 308 may be formed of similar materials and processes as the UBMs 242, described above. The through vias 504 provide interconnections between the redistribution structures 306 and 508.

Figure 25:
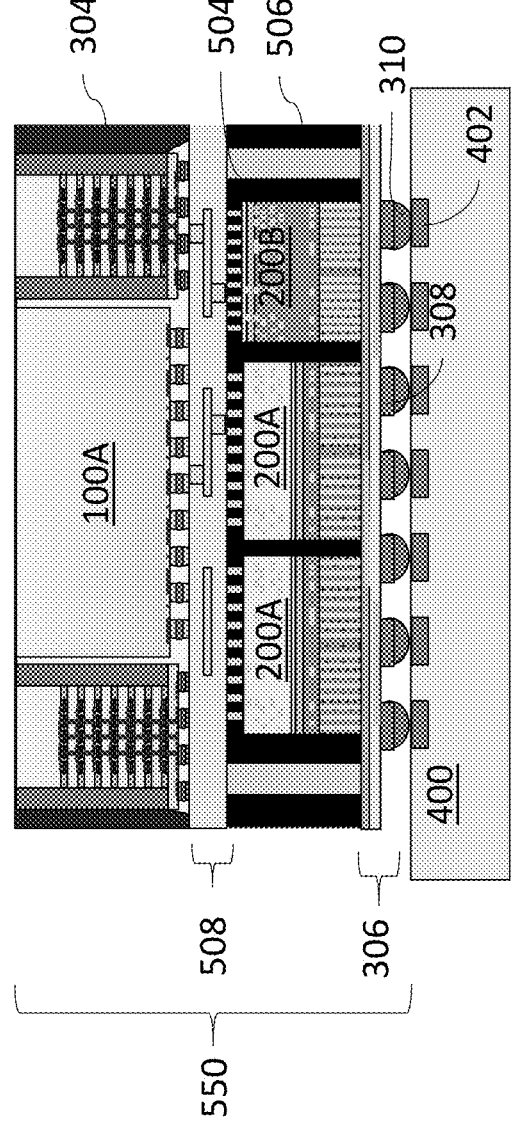

In FIG. 25, a singulation process is applied to separate individual packages 550 from other packages formed on the carrier substrate 500. The singulation process may include sawing, dicing, or the like. For example, the singulation process can include sawing the encapsulant 304, the redistribution structure 508, the encapsulant 506, and the redistribution structure 306. The singulation process singulates each package 550 from adjacent packages 550. As a result of the singulation process, the outer sidewalls of the encapsulant 304, the redistribution structures 508 and 306, and the encapsulant 506 are laterally coterminous (within process variations). The package 550 will then be attached to a package substrate 400 in a similar manner as described above, thus completing formation of the integrated circuit package.

In accordance with some embodiments, semiconductor devices may be bonded together to provide a package having multiple dies bonded to an interposer. The interposer may include metallization layers that are plated in patterned photoresist masks, which are subsequently replaced with organic insulating layers. Optionally, the interposer may further include additional metallization layers formed in inorganic insulating materials through damascene processes. The inclusion of metallization layers in organic insulating layers allows of improved signal integrity and/or power integrity at high, operating frequencies (e.g., greater than 20 GHZ). Further, embodiments including metallization layers formed in both organic and inorganic insulating materials may provide improved flexibility in terms of processing and packaging design.

In some embodiments, a device package includes an interposer comprising: a semiconductor substrate; first through vias extending through the semiconductor substrate, wherein the first through vias protrude from a front side of the semiconductor substrate; an interconnect structure over the front side of the semiconductor substrate. The interconnect structure comprising: a first metallization pattern in an inorganic insulating material; and a passivation film over the first metallization pattern. The interposer further includes a first redistribution structure over the passivation film, the first redistribution structure comprising a second metallization pattern in an organic insulating material, the first redistribution structure being coterminous with the interconnect structure and the semiconductor substrate. The device package further includes an integrated circuit die over and attached to the interposer; and a first encapsulant around the integrated circuit die. Optionally, in some embodiments, the interconnect structure further comprises a contact pad in the passivation film, wherein the second metallization pattern is electrically connected to the contact pad, and wherein the contact pad is made of a different material than the first metallization pattern. Optionally, in some embodiments, the contact pad is made of aluminum. Optionally, in some embodiments, the second metallization pattern extends through the passivation film the first metallization pattern. Optionally, in some embodiments, wherein the organic insulating material extends through the passivation film. Optionally, in some embodiments, wherein the interposer and the first encapsulant are co-terminus. Optionally, in some embodiments, the package further includes a second encapsulant around the interposer; and a second redistribution structure over the interposer and the second encapsulant, wherein the second redistribution structure electrically connects the integrated circuit die to the interposer. Optionally, in some embodiments, the package further includes second through vias extending through the second encapsulant. Optionally, in some embodiments, the package further includes a third redistribution structure on an opposing side of the interposer as the integrated circuit die. Optionally, in some embodiments, the interposer is free of any active devices.

In some embodiments, a device package includes an interposer free of any active devices, the interposer comprising: a semiconductor substrate; an interconnect structure comprising a first metallization pattern in a first insulating material; and a first redistribution structure comprising a second metallization pattern in a second insulating material, wherein the second insulating material has a lower loss tangent than the first insulating material. The device package further includes an integrated circuit die electrically connected to the interposer, wherein the interconnect structure and the first redistribution structure are each between the integrated circuit die and the semiconductor substrate; a first encapsulant around the integrated circuit die, the first encapsulant completely surrounding the integrated circuit die in a plan view, outer sidewalls of the first encapsulant being coterminous with outer sidewalls of the interposer; and a second redistribution structure on an opposing side of the interposer as the integrated circuit die. Optionally, in some embodiments, the first insulating material is an inorganic material, and wherein the second insulating material is an organic material. Optionally, in some embodiments, the first metallization pattern is electrically connected to the second metallization pattern by an aluminum contact pad. Optionally, in some embodiments, the first metallization pattern is in physical contact with the second metallization pattern.

In some embodiments, a method includes forming an interconnect structure on a substrate, wherein the interconnect structure comprises a first metallization pattern formed by a damascene process; forming a redistribution structure on the interconnect structure, wherein the redistribution structure comprises a second metallization pattern formed by a different type of process than the first metallization pattern; bonding a integrated circuit die over the redistribution structure; encapsulating the integrated circuit die in an encapsulant; and performing a singulation process. Performing the singulation process comprises singulating through the interconnect structure, the redistribution structure, and the encapsulant. Optionally, in some embodiments, the damascene process comprises: patterning an opening in an inorganic dielectric layer; and plating the first metallization pattern in the opening. Optionally, in some embodiments, forming the second metallization pattern comprises: depositing a seed layer over the interconnect structure; patterning an opening in a photoresist over the seed layer; plating the second metallization pattern in the opening; removing the photoresist; and depositing an organic insulating material around the second metallization pattern. Optionally, in some embodiments, the method further includes after bonding the integrated circuit die, performing a singulation process on the interconnect structure, the redistribution structure, and the substrate. Optionally, in some embodiments, the method further includes prior to bonding the integrated circuit die, performing a singulation process on the interconnect structure, the redistribution structure, and the substrate. Optionally, in some embodiments, the method further includes forming an aluminum contact pad over the first metallization pattern, wherein the aluminum contact pad electrically connects the first metallization pattern to the second metallization pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device package comprising:
an interposer comprising:

a semiconductor substrate;

first through vias extending through the semiconductor substrate, wherein the first through vias protrude from a front side of the semiconductor substrate;

an interconnect structure over the front side of the semiconductor substrate, the interconnect structure comprising:

a first metallization pattern in an inorganic insulating material; and a passivation film over the first metallization pattern; and a first redistribution structure over the passivation film, the first redistribution structure comprising a second metallization pattern in an organic insulating material, the organic insulating material of the first redistribution structure having the substantially same lateral extents as the inorganic insulating material of the interconnect structure and having the substantially same lateral extents as a semiconductor material of the semiconductor substrate;

an integrated circuit die over and attached to the interposer; and a first encapsulant around the integrated circuit die.

2. The device package of claim 1, wherein the interconnect structure further comprises a contact pad in the passivation film, wherein the second metallization pattern is electrically connected to the contact pad, and wherein the contact pad is made of a different material than the first metallization pattern.

3. The device package of claim 2, wherein the contact pad is made of aluminum.

4. The device package of claim 1, wherein the second metallization pattern extends through the passivation film to the first metallization pattern.

5. The device package of claim 4, wherein the organic insulating material extends through and directly contacts sidewalls of the passivation film.

6. The device package of claim 1, wherein the interposer and the first encapsulant are co-terminus.

7. The device package of claim 1, further comprising:

a second encapsulant around the interposer; and a second redistribution structure over the interposer and the second encapsulant, wherein the second redistribution structure electrically connects the integrated circuit die to the interposer.

8. The device package of claim 7 further comprising second through vias extending through the second encapsulant.

9. The device package of claim 1, further comprising a third redistribution structure on an opposing side of the interposer as the integrated circuit die.

10. The device package of claim 1, wherein the interposer is free of any active devices.

11. A device package comprising:

an interposer free of any active devices, the interposer comprising:

a semiconductor substrate;

an interconnect structure comprising a first metallization pattern in a first insulating material; and a first redistribution structure comprising a second metallization pattern in a second insulating material, wherein the second insulating material has a lower loss tangent than the first insulating material;

an integrated circuit die electrically connected to the interposer, wherein the interconnect structure and the first redistribution structure are each between the integrated circuit die and the semiconductor substrate;

a first encapsulant around the integrated circuit die, the first encapsulant completely surrounding the integrated circuit die in a plan view, outer sidewalls of the first encapsulant being coterminous with outer sidewalls of the interposer; and a second redistribution structure on an opposing side of the interposer as the integrated circuit die.

12. The device package of claim 11, wherein the first insulating material is an inorganic material, and wherein the second insulating material is an organic material.

13. The device package of claim 11, wherein the first metallization pattern is electrically connected to the second metallization pattern by an aluminum contact pad.

14. The device package of claim 11, wherein the first metallization pattern is in physical contact with the second metallization pattern.

15. A package comprising:

an interposer comprising:

a semiconductor substrate;

first through vias extending through the semiconductor substrate, wherein the first through vias protrude from a lateral surface of the semiconductor substrate;

an interconnect structure over a first side of the semiconductor substrate, the interconnect structure comprising:

a first metallization pattern in an inorganic insulating material; and a passivation layer over the first metallization pattern; and a first redistribution structure over the passivation layer, the first redistribution structure comprising a second metallization pattern in an organic insulating material, wherein a thickness of the first metallization pattern is less than a thickness of the second metallization pattern, and wherein the organic insulating material of the first redistribution structure has the substantially same lateral extents as a semiconductor material of the semiconductor substrate;

an integrated circuit die bonded to the interposer;

an underfill between the integrated circuit die and the interposer, wherein the underfill extends along a sidewall of the integrated circuit die; and a first encapsulant surrounding the integrated circuit die and the underfill, wherein the first encapsulant is coterminous with the interposer.

16. The package of claim 15, wherein the first through vias extend continuously from the first metallization pattern to a second side of the semiconductor substrate, the second side of the substrate being opposite to the first side of the semiconductor substrate.

17. The package of claim 15, wherein a loss tangent of the organic insulating material is less than 0.03.

18. The package of claim 15, wherein the second metallization pattern extends through the passivation layer, and wherein the organic insulating material extends through the passivation layer.

19. The package of claim 15 further comprising an aluminum contact pad electrically connecting the second metallization pattern to the first metallization pattern, wherein the passivation layer covers edge regions of the aluminum contact pad.

20. The package of claim 15, wherein the organic insulating material of the first redistribution structure has the substantially same lateral extents as the inorganic insulating material of the interconnect structure.

* * * * *